United States Patent [19]

Schafer

[11] Patent Number: 5,336,529

[45] Date of Patent: Aug. 9, 1994

[54] METHOD FOR COATING CIRCUITBOARDS

[75] Inventor: Hans J. Schafer, Viersen, Fed. Rep. of Germany

[73] Assignee: Rutgerswerke Aktiengesellschaft, Fed. Rep. of Germany

[21] Appl. No.: 30,217

[22] PCT Filed: Jan. 4, 1993

[86] PCT No.: PCT/EP93/00004

§ 371 Date: Mar. 9, 1992

§ 102(e) Date: Mar. 9, 1992

[87] PCT Pub. No.: WO93/14444

PCT Pub. Date: Jul. 22, 1993

[30] Foreign Application Priority Data

Jan. 7, 1992 [DE] Fed. Rep. of Germany ....... 4200149
Feb. 8, 1992 [DE] Fed. Rep. of Germany ... 9201546[U]

[51] Int. Cl.$^5$ .............................................. B05D 5/12
[52] U.S. Cl. .................................. 427/487; 427/96; 427/493; 427/512; 427/542; 427/557; 427/561; 427/581
[58] Field of Search ............... 427/487, 493, 512, 542, 427/557, 561, 581, 961

Primary Examiner—Bernard Pianalto
Attorney, Agent, or Firm—Bierman and Muserlian

[57] ABSTRACT

Bubble-free solder stop lacquer coatings of circuitboards are obtained for high conductor runs and close spacing, in that one proceeds from a photopolymerizable low-solvent lacquer, which is heated to pouring viscosity through a heatable roll and doctor blade by means of infrared lamps and is poured onto cooled circuitboards as a lacquer curtain.

3 Claims, 1 Drawing Sheet

METHOD FOR COATING CIRCUITBOARDS

Underlying the present invention is the task to make available an improved method and an apparatus which makes it possible to coat circuitboards with photopolymerizable lacquers by the curtain pouring process.

The curtain pouring process is described in U.S. Pat. No. 4,230,793. To obtain uniform lacquer layers it is necessary to have as low as possible a lacquer viscosity. This low viscosity, however, causes the lacquer to run off the condutctor edges (edge flight), thus leading to insufficient edge covering.

This problem is described in EP-A 0,075,537 and has been solved by addition of finely divided filler. The required viscosity of 380 mPa.s is reached only at a solids content of 33 to 40 percent by addition of solvents.

The high percentages of solvent require a very slow and costly drying. There is danger of air bubbles and solvent inclusions in particular if the conductors are narrow and high.

It is, therefore, an object of the invention to provide an ecophile possibility of coating circuitboards, preferably by curtain pouring, which can be carried out with a minimum of solvent or even none at all, and in which the inclusion of air bubbles and solvent residues is minimized even for high and narrow conductors.

It is an object of the invention also to achieve as uniform as possible a coatting with minimum edge flight.

The subject of the present invention therefore is a method which proceeds from a photopolymerizable lacquer low in solvents or free of solvents whose viscositty is reduced by brief heating in an apparatus according to the invention and which then impinges in the form of a heated lacquer curtain on a cooled circuitboard which is shot through the curtain.

In the method according to the invention, photopolymerizable lacquer systems with little to no solvent, having a solids content of 80 to 100 percent by weight, preferably 85 to 95%, are scooped with a heatable roll out of a vat temperature-controlled to 60° to 80° C. and are degased with a heatted doctor blade at temperatures of 60° to 90° C., preferably 70° to 80° C., and are briefly heated by infrared lamps and caused to flow.

BRIEF DESCRIPTION OF THE DRAWING

The drawing shows an apparatus for coating circuit boards according to the invention.

DETAILED DESCRIPTION OF THE INVENTION

Figure 1:
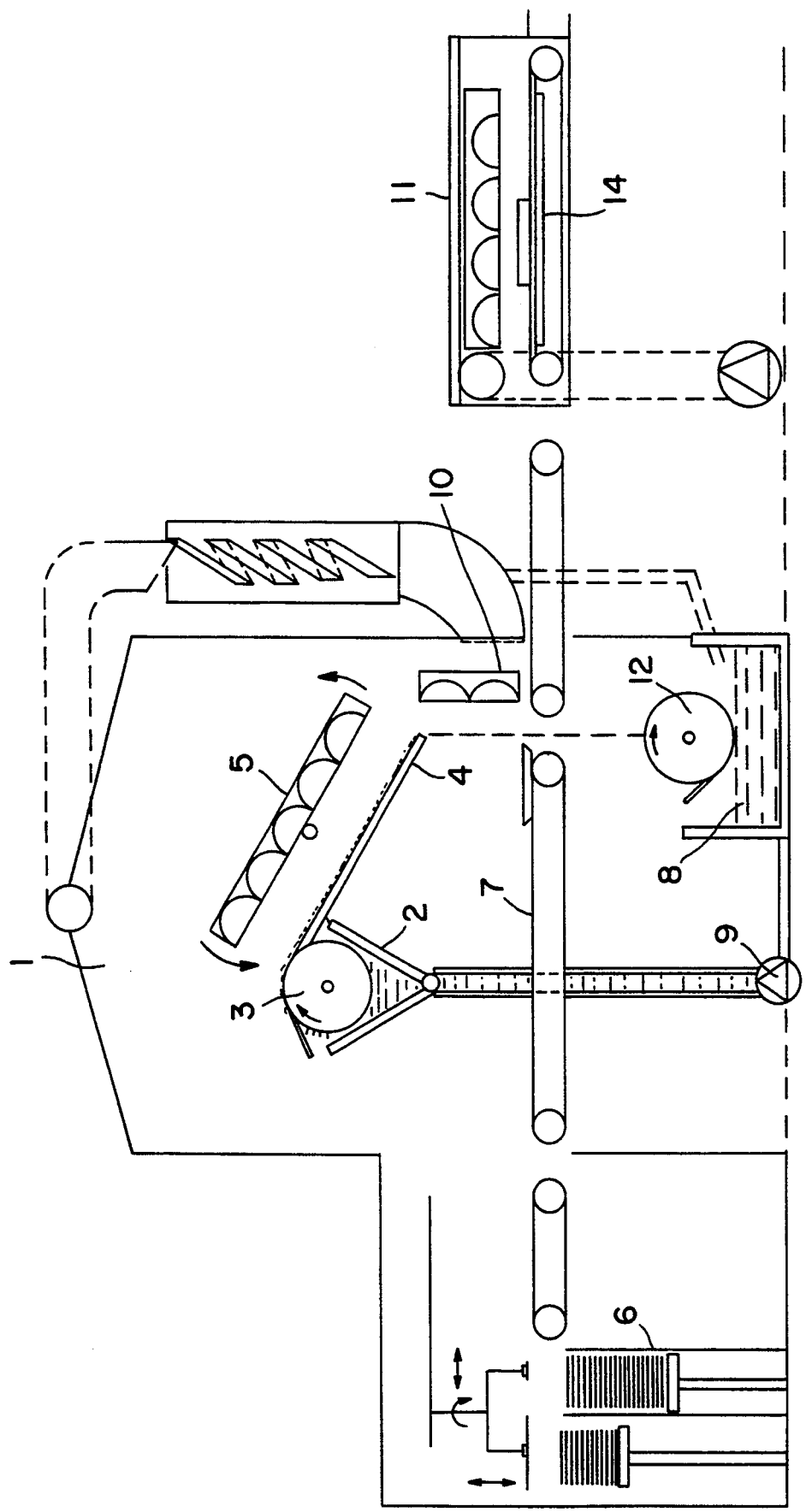

In continuous process a curtain of liquid is formed by the flowing down of the lacquer system heated to 100° to 160° C., which has a viscosity of 100 to 500 mPa·s, preferably 100 to 180 mPa·s, from an inclined doctor blade, the circuitboards being moved through the curtain at a speed of preferably 150 to 300 m/min, being thus coated. Lacquer layers of a thickness of 5 to 30 μm are obtained.

According to the invention, the circuitboards to be coated are not heated, but rather are cooled to a temperature in the range of from −20° to +25° C., preferably from −10° to +10° C.

At 20° C. the lacquers used according to the invention have a viscosity of 10,000 to 150,000 mPa·s. As they can contain no or only small amounts of solvents, no fillers are needed to adjust the viscosity. Possibly, for economic reasons, the lacquer system may contain up to 50% by weight, preferably up to 10%, of fillers known in themselves.

The preferred binders for the photo-hardening lacquers are those which contain both photo-hardening unsaturated groups as well as thermally crosslinkable ones, as for instance epoxide groups. This makes it possible to pre-crosslink the coated boards by radiation and subsequently to achieve a final hardening by thermal treatment. Such binders are known e.g. from EP-B 0,194,360.

The apparatus for the coating of circuitboards according to the invention is a coating machine where in a coating installation for the curtain pouring process, above the conveyor belt (7) for the circuitboards, a heatable roll (3) is arranged in a gutter-like heatable vat (2), a heatable doctor blade (4) being applied against the roll, over which infrared lamps (5) are arranged parallel to the doctor blade.

The heatable roll has a diameter of about 10 to 30 cm and the gutter-like vat a diameter about 2 to 5 cm larger. The heatable doctor blade is arranged inclined downwardly and is about 30 to 70 cm long and serves as run-off plate, at which the lacquer can be degased and heated in a thin layer. In addition to this doctor blade there is applied on the roll also at least one scraper blade which is adjustable in width and/or thickness. Upstream of the heatable vat are a coolable storage tank (8) and a proportioning device (9). The storage tank (8) serves at the same time as catch bin for the lacquer not used up for coatings that has run off the doctor blade.

In the preferred embodiment, at the end of the heatable doctor blade there is arranged perpendicularly at least one infrared lamp (10), with which the temperature of the flowing lacquer curtain can be controlled.

Preceding the conveyor belt for the circuitboards is a cooling room (6) which cools the circuitboards to the desired temperature.

During operation of the apparatus according to the invention, the heatable roll (3) scoops lacquer out of a temperature-controlled gutter-like vat (2). This lacquer film is taken off the roll with a heated doctor blade (4). Above the doctor blade an infrared lamp (5), suspended centrally, is provided. By inclined mounts, in particular by slanted setting, a variable lamp distance can thus be adjusted, which is smallest at the beginning of the doctor blade. The radiation temperature is set at 160° to 220° C. so that good IR absorption of the lacquer is ensured. The lacquer is then heated at a flow velocity of 2 to 4 lt/min to 100° to 160° C. in 1 to 2 seconds, without verheating it. By the arrangement according to the invention of the lamp and of the doctor blade provided with a chromium-plated surface it is possible to heat the lacquer film in a controlled manner. As the doctor blade is traversed by a liquid medium, should the film be overheated, this provides for cooling thereof.

Depending on the setting of the infrared lamps, it may be advantageous, in particular for reactive lacquers, to still raise the temperature of the lacquer only during the fall from the doctor blade edge onto the circuitboard. This is done by at least one additional infrared lamp (10) disposed at the end of the heatable doctor blade perpendicularly, i.e. parallel to the curtain.

As photopolymerizable lacquers are thermally very unstable compounds, only a brief heating is permitted in processing them. With the apparatus according to the invention it is possible for the first time to heat the lacquer rapidly to pouring temperature without exceeding the temperature at which the polymerization sets in.

This lacquer, brought down after the IR melting to a viscosity of 100 to 500 mPa·s, flows down along an inclined doctor blade about 20 to 70 cm long, and falls as a curtain onto the circuitboard, which is guided through at a speed of 150 to 300 m/min, preferably at a speed of 250 to 300 m/min.

According to prior art, a low viscosity of the lacquer leads to little edge covering of the conductor runs. According to the invention, this problem is solved in that the circuitboards are not, as previously customary, heated before the coating.

It has been found, surprisingly, that with the method of the invention heating is not necessary. On the contrary, it was found that prior cooling of the circuitboards has a positive effect on the coating result. The lacquer viscosity rises suddenly after the impingement on the circuitboard surface, so that, in particular due to the good thermal conductivity of the copper conductors, run-off from the edges is avoided.

By the method of the invention it has been possible to coat short distances between high conductors perfectly without solvent inclusions occurring. Any air and residual solvents still present are removed, according to the invention, in a following IR radiation oven (11) under vacuum. This evacuable IR oven heats the lacquer surface, the lacquer viscosity at which good vacuum degasing is ensured being adjustable by the selected lamp temperature, which is preferably between 60° and 180° C. The previous cooling of the circuitboard results in that the radiation is not absorbed by the conductor runs. The lacquer is heated least at the conductor flanks and therefore cannot run off. In the valleys between the conductors, on the other hand, effective vacuum degasing is made possible.

Thereafter the circuits are exposed in known manner in off contact or soft contact to UV light of wavelength 350 to 400 nm, developed, and fully cured.

As binders can be used photopolymerizable resins of different chemical composition, as known to the specialist. There can be used lacquers containing little to no solvent, depending on the mean molecular weight of the resin raw material. At the same time the mean molecular weight affects the softening point of the physically dried lacquer. While, for example, a solvent-free lacquer having a mean molecular weight of 500 gives after coating a tacky lacquer layer before exposure, with binders of a mean molecular weight greater than 3000 a non-tacky lacquer film can be produced. It has now been found that by the creation of a solvent-free lacquer film the method according to the invention offers the possibility to obtain by the reduction of the molecular weight a lacquer of higher solid substance without the lacquer film being tacky at room temperature before the exposure. Thus, lacquers can be produced with a solids content of more than 80% by weight which after coating no longer contain the previously normal 3 to 5% residual solvents in the lacquer film and which thus give a non-tacky lacquer layer.

As, according to the invention, it is not necessary to thixotropize the lacquer with fillers in order to achieve better edge covering of the conductors, fillers can be dispensed with to a large extent. It was further found that the adhesion of the lacquer to metal is clearly increased by addition of epoxysilane as used for fiber finish in glass fiber reinforrced plastic composite materials. Also it was found that in the case of solvent-free lacquers, in contrast to German patent DE-A 36 13 107, the addition of reactive thinners should not be higher than 5%, as otherwise the lacquer film loses elasticity and tears, or bursts, under the stress of soldering.

For such binders, which contain free epoxide groups besides the photo-hardening unsaturated groups, the group of the phenolic novolacs has proved to be a suitable hardener component for thermal hardening. With it a long service period at 40° to 50° C. as well as fast hardening were achieved.

The filler-free lacquer formulation according to Example 3 has contributed to a solder stop lacquer layer with a much lower solder bead affinity.

EXAMPLE 1

Photopolymerizable solder stop lacquer with a solids content of 85 to 95%, Resin A per EP-B 0,194,360 of a molecular weight of 1500 to 2000.

| | |
|---|---|
| 80.00 parts by wt | Resin A 85% |
| 2.00 parts by wt | Ethylanthraquinone |
| 0.50 parts by wt | Phthalocyanine Green |
| 1.00 parts by wt | Epoxysilane Z 6040 (Dow Corning) |
| 8.00 parts by wt | Bisphenol A Novolac |
| 1.00 part by wt | 2-ethyl-4-methylimidazole |
| 1.00 parts by wt | Byk TM -361 leveling agent |
| 0.50 parts by wt | Byk TM -055 antifoaming agent |
| 3.00 parts by wt | Barium sulfate |
| 3.00 parts by wt | Microtalc |
| 100.00 parts by wt | = 88% by weight |

EXAMPLE 2

Photopolymerizable solder stop lacquer with 90 to 95% solids, Resin B according to EP-B 0,194,360 having a molecular weight of 1000 to 1500.

| | |
|---|---|
| 80.00 parts by wt | Resin B solid substance 90% |
| 2.00 parts by wt | Ethylanthraquinone |
| 0.50 parts by wt | Phthalocyanine Green |
| 1.00 part by wt | Epoxysilane Z 6040 (Dow Corning) |
| 9.00 parts by wt | Polyhydroxystyrene (80%) |
| 1.00 part by wt | 2-ethyl-4-methyl imidazole |
| 0.50 parts by wt | Byk TM -361 leveling agent |
| 0.50 parts by wt | Byk TM -055 antifoaming agent |
| 2.50 parts by wt | Barium sulfate |
| 3.00 parts by wt | Microtalc |
| 100.00 parts by wt | = 93% by weight |

EXAMPLE 3

Photopolymerizable solder stop lacquer with 95 to 100% solid substance, Resin C according to EP-B 0,194,360 of a molecular weight of 500 to 700.

| | |
|---|---|
| 80.00 parts by wt | Resin C, 100% solid substance |
| 4.00 parts by wt | Triethylpropanetriacrylate |
| 2.00 parts by wt | Ethylanthraquinone |
| 0.30 parts by wt | Epoxysilane Z 6040 (Dow Corning) |
| 0.50 parts by wt | Phthalocyanine Green |
| 11.50 parts by wt | o-cresol Novolac |
| 1.00 part by wt | 2-ethyl-4-methyl imidazole |
| 0.30 parts by wt | Byk TM -361 leveling agent |
| 0.40 parts by wt | Byk TM -055 antifoaming agent |
| 100.00 parts by wt | = 99% by weight |

The lacquer mixtures per Examples 1 to 3 are placed in the apparatus according to the invention to carry out the coating method according to the invention. Here they are heated to about 30° to 50° C. in a lacquer tank.

The viscosity is about 1000 to 5000 mPa·s. At this viscosity they are pumped into the heated lacquer vat (2), the walls of which are heated to 70° C. In this vat (2), which for optimum lacquer distribution is V-shaped with an angle of 60°, the lacquer is pumped in from below through a slit type opening in the bottom. In this vat (2) a heated roll (3) is arranged so that the distance from the outermost vat edge can be reduced to zero. Thus, by a defined gap adjustment the entrainment of lacquer can be adjusted in a controlled manner. The heated roll (3) has a temperature of 80° C.

The lacquer is taken up by the roll and transferred to a heated inclined doctor blade (4). The roll (3) and doctor blade (4) have chromium-plated surfaces and are traversed by liquid heating media. The doctor blade (4) has a temperature of 80° C.

For fast heating of the lacquer film, an infrared lamp (5) is disposed above the doctor blade (5). It has been found that a lamp temperature of 160° to 220° C. ensures a good IR absorption of the lacquer. Now, due to the decreased viscosity, the lacquer flows down along the inclined doctor blade (4) and falls in the form of acurtain onto the circuitboards, which are moved through at a speed of 150 to 300 m/min. Before the coating these circuitboards are cleaned in a pumice meal brush installation and, counter to previous practice, are not heated but cooled by a cooling room (6) to +25° to −20° C., preferably to +10° to −10° C. Subsequently this board goes into the closed coating room (1), which is filled with inert gas. After leaving the coating room, the coated circuitboard is transported into an evacuable radiation oven (11).

In this radiation oven (11) residual solvent and air inclusions are removed. The solvent-free and air bubble-free lacquer layer can now be exposed, depending on its state (tacky or non-tacky) in UV light at a wavelength of 350 to 400 nm. The developing depends on the lacquer system and can take place with solvents or aqueous-alkaline in a manner known in itself.

The excess lacquer is cooled down again to process temperature of 30° to 50° C. using a cooling roll (12) and is returned to the storage vessel.

Besides solder stop lacquers there can be applied preferably also solvent-free etch resists. With them the holes in the circuitboards can be covered. Thereby a substitute for the solid resist foils is achieved. The special flexibility due to the loss-free and thickness-variable application technique leads to considerable savings.

EXAMPLE 4

Photopolymerizable etch resist with 95 to 100% solid substance; Resin C per EP-B 0,194,360 having a molecular weight of 500 to 700.

| | |
|---|---|
| 94.50 parts by wt | Resin C 100% |
| 3.00 parts by wt | Ethylanthraquinone |
| 1.50 parts by wt | Byk TM -361 leveling agent |
| 0.50 parts by wt | Byk TM -055 antifoaming agent |
| 0.50 parts by wt | Savinyl Blue |
| 100.00 parts by wt | = 99% by weight |

As solvent-free lacquers do not give a non-tacky lacquer film before exposure and therefore must be exposed in off-contact, only one side can be exposed, which leads to a considerable loss of capacity. On the other hand, for the ultrafine-conductor technology it is necessary to expose with so-called cold UV light at 20° to 23° C., to obtain maximum reproducibility, while ordinary UV exposers still have a high infrared component, which, despite intensive cooling, heats the substrate to 40° to 50° C.

It has been found, surprisingly, that when exposing with cold UV light unusually long exposure times were necessary for resists applied from solution. On investigating this phenomenon it was found that the solvent parts of 3 to 5% remaining after drying, acting as inhibitor, retard or completely impede the UV hardening. With the hitherto customary exposers, these residual solvents are evidently removed by the IR component in the UV light to the extent that the hardening is no longer impeded. Therefore, to achieve highest precision in ultrafine conductor technology in particular for multilayer interior installations, the so-called Accutrace method is used. Here a solvent-free lacquer is applied with a roller coater and then exposed in off-contact. The disadvantage of this process resides in the off-contact exposure, which makes possible only one half the capacity, as well as in the fact that so-called "via holes" cannot be covered any more. For lacquers applied from solution there is also the problem of the "via holes" that cannot be covered, to protect the hole walls during etching.

With the method according to the invention it is possible to solve these problems. While with a lacquer formulation according to Example 4 a hole covering to 1.5 mm is possible, with a so-called "high solid" lacquer mixture a tack-free coating can be obtained which permits bilateral exposure in the contact process, hardening in cold UV light being ensured by the absence of solvent in the lacquer film.

EXAMPLE 5

Photopolymerizable etch resist with 80 to 85% solid substance, Resin E per EP-B 0,194,360 having a molecular weight of 2000 to 2500.

| | |
|---|---|
| 88.00 parts by wt | Resin E 80% |
| 7.00 parts by wt | MgO |
| 3.00 parts by wt | Ethylanthraquinone |
| 1.00 part by wt | Byk TM -361 leveling agent |
| 0.50 parts by wt | Byk TM antifoaming agent |
| 0.50 parts by wt | Savinyl Blue |
| 100.00 parts by wt | = 82% by wt |

The etch resist according to Example 5 is applied with the apparatus according to the invention and the residual solvent is removed in a vacuum oven. It has heretofore been especially disadvantageous that it is not possible by curtain coating to go below a layer thickness of 60 μm. This is attributable on the one hand to the minimum curtain thickness, which for reasons of stability can not be gone below; on the other hand the coating speed cannot be increased over 200 m/min without the circuitboards on a conveyor belt bursting as they impinge on the lacquer curtain, so that uniform coating is not possible. It has now been found that at coating speeds of 250 to 300 m/min lacquer layers of 5 to 30 μm are obtainable. For this an apparatus according to the invention is used, which may be referred to as a coating slide.

The multilayer interior installations are held at the edge with suction cups. These suction cups are mounted on pairs of mounts equipped with a toggle joint, which mounts are in turn guided on rails installed outside the lacquer curtain. The circuitboard or multilayer interior installation thus fastened can now be moved through under the curtain at high speed without coating faults occurring. This coating slide can alternatively be guided at 70° or 110° to the curtain, certain coating effects being obtainable thereby. The etch resist layers of 5 to 30 μm thus obtained are tack-free after drying in a vacuum oven and can be exposed in cold UV light at a wavelength of 300 to 450 nm on both sides in the contact process. Developing is done in solvents, butyl diglycol having proven to be especially suitable. After etching in acid to weakly alkaline etch solutions, stripping is done in alkaline medium at pH 10 to 14.

This method makes possible for the first time to utilize the advantages of liquid resist coating (high image resolution, good adhesion) without having to forgo the requirements of hole covering hitherto fulfilled only by solid resist foils.

In bilateral coating and exposure it is especially important to cool the circuitboard before the second coating and to keep the already coated side tack-free during drying in the vacuum radiation oven. In addition, heating of the circuitboard to over 25° C. before the exposure should be avoided.

This is achieved according to the invention in that the floor of the vacuum radiation oven is equipped with a chromium-plated cooling plate (14), which prevents the circuitboard from heating up during the IR radiation action and prevents the first lacquer film from sticking.

EXAMPLE 6

(process example)

| Lacquer formulation | Photopolym. solder stop lacquer Example 3 | Photopolym. etch resist Example 5 |
| --- | --- | --- |
| Viscosity, mPa.s 20° C. | 150,000 | 80,000 |
| Pouring temperature, °C. | 80 | 70 |
| Pouring viscosity, mPa.s | 150 | 170 |
| Flow velocity, lt/min | 3 | 3 |
| Circuitboard temperature, °C. | −10 | +15 |
| Coating speed | 180 m/min | 250 m/min |
| Lacquer application, g/m² | 80 | 25 |
| Doctor blade/roll temperature, °C. | 80 | 80 |
| Lamp temperature, °C. | 180 | 180 |
| Cooling roll temperature, °C. | +10 | +10 |
| Lamp vacuum oven, °C. | 130 | 130 |
| Vacuum time | 20 | 40 |
| Cooling plate, °C. | +10 | +10 |
| Vacuum surface at 20° C. | tacky | dry |
| Exposure (390 nm) | 20 | 10 |
| Exposure mode | off contact | contact |
| Developing in butyl diglycol | 60 | 60 |
| Hardening at 150° C. (min) | 60 | — |
| Test results: | | |
| Conductor run height μm | 80 | — |
| Conductor run width μ, | 100 | — |
| Edge covering | 57% | — |
| Residual solvent, % | 0 | 0.01 |
| Solder bath at 290° C. | 90 | — |
| Resolution/etch wedge μm | — | 20 |

I claim:

1. A curtain pouring method of coating circuit boards with a photopolymerizable lacquer comprising removing a photopolymerizable lacquer with a high solids contact of 80 to 100% by weight from a vat at a temperature of 48° to 60° C. with a heatable roll, applying the lacquer to a doctor-blade heated at 60° to 90° C., subjecting the doctor blade to infra red lamps whereby the lacquer flows and pouring the lacquer at a viscosity of 100 to 500 mPa·s onto circuit boards cooled to −20° to 25° C. to form a coating.

2. The method of claim 1 wherein the doctor blade is heated to 70° to 80° C. and the circuit boards are cooled to −10° to +10° C.

3. The method of claim 2 wherein the lacquer contains 0 to 10% by weight of fillers.

* * * * *